United States Patent [19]
Chen et al.

[11] Patent Number: 5,747,834
[45] Date of Patent: May 5, 1998

[54] ADJUSTABLE BIPOLAR SCR HOLDING VOLTAGE FOR ESD PROTECTION CIRCUITS IN HIGH SPEED BIPOLAR/BICMOS CIRCUITS

[76] Inventors: Julian Zhiliang Chen, 5759 Pineland Dr., Dallas, Tex. 75231; Ajith Amerasekera, 1800 Lake Crest La., Plano, Tex. 75023; Thomas A. Vrotsos, 1201 Ashland Dr., Richardson, Tex. 75080

[21] Appl. No.: 721,289

[22] Filed: Sep. 26, 1996

Related U.S. Application Data

[60] Provisional application No. 60/004,523, Sep. 29, 1995, abandoned.

[51] Int. Cl.$^6$ .......................... H01L 29/74; H01L 31/111
[52] U.S. Cl. .......................... 257/111; 257/173; 257/146; 257/603
[58] Field of Search .......................... 257/111, 173, 257/174, 146, 355, 356, 358, 362, 363, 603

[56] References Cited

U.S. PATENT DOCUMENTS

| | | |
|---|---|---|
| 4,631,561 | 12/1986 | Foroni . |
| 4,633,283 | 12/1986 | Avery . |
| 4,896,243 | 1/1990 | Chatterjee et al. .......................... 362/91 |
| 5,012,317 | 4/1991 | Rountree . |
| 5,060,037 | 10/1991 | Rountree . |
| 5,077,591 | 12/1991 | Chen et al. . |
| 5,225,702 | 7/1993 | Chatterjee .......................... 257/360 |
| 5,268,888 | 12/1993 | Marum .......................... 257/362 |
| 5,290,724 | 3/1994 | Leach .......................... 437/51 |
| 5,548,134 | 8/1996 | Tailliet .......................... 257/173 |

OTHER PUBLICATIONS

Z. Chen et al., Bipolar SCR ESD Protection Circuit for High Speed Submicron Bipolar/BiCMOS Circuits; IEDM 1995 (International Electron Devices Meeting), pp. 337–340.

*Primary Examiner*—Ngân V. Ngô
*Attorney, Agent, or Firm*—Stanton C. Braden; Wade James Brady, III; Richard L. Donaldson

[57] ABSTRACT

The invention provides a Bipolar structure such as a silicon controlled rectifier (SCR) that exhibits advantageously low triggering and holding voltages for use in high speed (e.g., 900 MHz->2 GHz) submicron ESD protection circuits for Bipolar/BiCMOS circuits. The Bipolar structure features a low shunt capacitance and a low series resistance on the input and output pins, allowing for the construction of ESD protection circuits having small silicon area and little to no impedance added in the signal path. In a preferred aspect of the invention, the SCR is assembled in the N-well of the Bipolar/BiCMOS device, as opposed to the P-substrate, as is customary in the prior art. A preferred aspect of the invention utilizes a Zener diode in combination with a resistor to control BSCR operation through the PNP transistor. The turn-on voltage of the Zener is selected so as to be comparable to the emitter-base breakdown voltage of the NPN structure, which is only slightly higher than the power supply voltage to ensure that the ESD protection circuit will not be triggered under normal circuit operation. During an ESD event, when pad voltage exceeds Zener breakdown voltage, the Zener breaks down, and current flows through an associated (polysilicon) resistor to trigger the PNP of the Bipolar SCR and thus activate the BSCR to conduct the High ESD current from the associated, protected circuit. BSCR resistance and Zener diode breakdown voltage values are selected which permit scaling of ESD protection circuit holding and trigger voltages for optimum compatibility with the power supply voltage.

13 Claims, 3 Drawing Sheets

ADJUSTABLE BIPOLAR SCR HOLDING VOLTAGE FOR ESD PROTECTION CIRCUITS IN HIGH SPEED BIPOLAR/BICMOS CIRCUITS

This application claims priority under 35 USC 119(e)(1) of provisional application Ser. No. 60/004,523, filed Sep. 29 1995, now abandoned.

FIELD OF THE INVENTION

This invention relates generally to electronic circuits, and more particularly to electrostatic discharge (ESD) protection circuits for Bipolar/BiCMOS circuits.

BACKGROUND OF THE INVENTION

The use of electrostatic discharge (ESD) protection circuits to protect input and output circuitry from ESD is well known, as taught in prior art U.S. Pat. No. 5,268,588; U.S. Pat. No. 4,896,243; U.S. Pat. No. 5,077,591; U.S. Pat. No. 5,060,037; U.S. Pat. No. 5,012,317; U.S. Pat. No. 5,225,702 and U.S. Pat. No. 5,290,724 all assigned to Texas Instruments Incorporated, the assignee herein. ESD protection circuits for Bipolar/BiCMOS technologies need to be able to protect the pull-down NMOS transistor in CMOS output buffers as well as the collector-base junction in NPN output transistor and the emitter-base junctions of emitter coupled logic (ECL) devices. The protection circuit is operable to turn-on at voltages that are lower than the trigger and holding voltages of their associated devices. The ESD protection circuit should also contribute minimal capacitance and require minimal surface area in order to be effective.

Many ESD protection circuits utilize a two stage protection scheme on circuit inputs as shown in prior art FIG. 1. Typically, the high current pulse of an ESD strike passes through the primary clamp, which clamps the pad voltage. However, this is still too high a voltage for the circuitry to receive, therefore the secondary clamp clamps the voltage to a safe value. The current limit structure restricts the current flow so that the secondary clamp does not have to be excessively large.

Present state-of-the art BiCMOS processes use NPN or SCR (silicon controlled rectifier) devices for ESD protection circuits. SCR devices designed for Bipolar circuits typically exhibit higher trigger voltages and comparable, or even lower, holding voltages as NPN transistors. As complimentary oxide semiconductor (CMOS) processes evolve to transistor shorter channel lengths and gate oxides, it becomes more difficult to protect both input and output circuits from damage due to electrostatic discharge.

High speed submicron Bipolar/BiCMOS circuit applications impose tight constraints on ESD protection circuits. Essential requirements are low shunt capacitance and low series resistance on input and output pins, which means that ESD protection circuits should require minimal silicon space and contribute virtually no impedance to the signal path. Trigger voltages ($V_t$) and clamp voltages ($V_{clamp}$) should also be below the "turn-on" (i.e., activation) voltages of the circuits being protected. NPN transistor ESD protection schemes have limitations for such systems. FIG. 2 graphically illustrates pulsed current-voltage curves of a 100 µm wide NPN transistor in 0.6 µm and 0.8 µm processes, for which the $V_{clamp}$ is 10 volts at 1.3 amp for 0.6 µm processes and 13 volts at 1.3 amp for 0.8 µm processes. These levels are too high to protect Bipolar/MOS input and output buffers as well as emitter coupled logic (ECL) devices in advanced submicron technologies. The high clamping voltage of the NPN structure is attributed to its high holding voltage ($V_h$) and the on-resistance value. In submicron Bipolar/BiCMOS processes, a protection NPN structure is normally operable in the avalanche mode in order to conduct the high ESD current. For a given process, setting of the $BV_{ceo}$ (breakdown at collector-emitter junction, base "open") therefore establishes the lower limit of the clamping voltage $V_{clamp}$. Clamp voltage can be lowered by lowering the on-resistance value, which can be accomplished by using larger NPN structures and higher capacitance loading. However, such approaches are not applicable to high speed submicron Bipolar/BiCMOS processes, since a large shunt capacitance will create an electrically "shorted" path for high frequency signal input and output.

In view of the foregoing deficiencies, it would be desirable to provide circuit configurations that enable BSCR protection circuits with high ESD performance which meet the foregoing requirements of reduced triggering and holding voltages for high speed circuit applications. It would be particularly advantageous to provide a Bipolar SCR protection circuit that can be fabricated in a submicron BiCMOS in the absence of additional masks for circuit implementation.

SUMMARY OF THE INVENTION

The invention provides a Bipolar structure such as a silicon controlled rectifier (SCR) that exhibits advantageously low triggering and holding voltages for use in high speed (e.g., 900 MHz - >2 GHz) submicron ESD protection circuits for Bipolar/BiCMOS circuits. The Bipolar structure features a low shunt capacitance and a low series resistance on the input and output pins, allowing for the construction of ESD protection circuits having small silicon area and little to no impedance added in the signal path. In a preferred aspect of the invention, the SCR is assembled in the N-well of the Bipolar/BiCMOS device, as opposed to the P-substrate, as is customary in the prior art.

A preferred aspect of the invention utilizes a Zener diode in combination with a resistor to control BSCR operation through the PNP transistor. The turn-on voltage of the Zener is selected so as to be comparable to the emitter-base breakdown voltage of the NPN structure, which is only slightly higher than the power supply voltage to ensure that the ESD protection circuit will not be triggered under normal circuit operation. During an ESD event, when pad voltage exceeds Zener breakdown voltage, the Zener breaks down, and current flows through an associated (polysilicon) resistor to trigger the PNP of the Bipolar SCR and thus activate the BSCR to conduct the High ESD current from the associated, protected circuit. BSCR resistance and Zener diode breakdown voltage values are selected which permit scaling of ESD protection circuit holding and trigger voltages for optimum compatibility with the power supply voltage.

BRIEF DESCRIPTION OF THE DRAWINGS

Further features and advantages of the present invention will become apparent from a reading of the specification in conjunction with the drawings, for which like reference characters represent corresponding parts throughout the various views and in which certain aspects of the depicted structures have been exaggerated for clarity, in which.

DETAILED DESCRIPTION OF THE PREFERRED EMBODIMENTS

Figure 1:
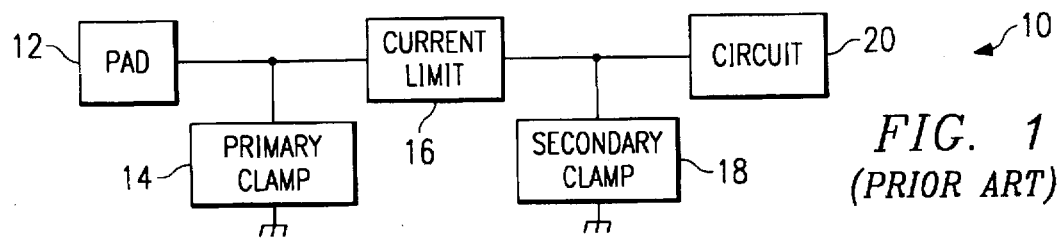
FIG. 1 is a block diagram illustrating a conventional ESD protection circuit.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

The ESD circuit of the present invention provides the relatively low shunt capacitance (typically <0.5 pF) and no appreciable resistance on circuit input and output pads that are desired for the present and future contemplated generations of submicron Bipolar/BiCMOS circuit protection schemes. ESD protection circuits provided in accordance with the present invention are operable to protect the pull-down NMOS transistor in CMOS output buffers, the collector-base junctions in NPN output transistors, and the emitter-base junctions in ECL outputs. Such ESD protection circuitry is operable to turn-on at voltages that are typically below the trigger voltages of these respective elements, and feature a holding voltage that is lower than the turn-on or activation voltages of these devices. As will be explained below, the reduction in turn-on and holding voltages is obtained through the operation of trigger elements that can optionally be integrated with the BSCR to form a protection circuit.

Figure 3A:
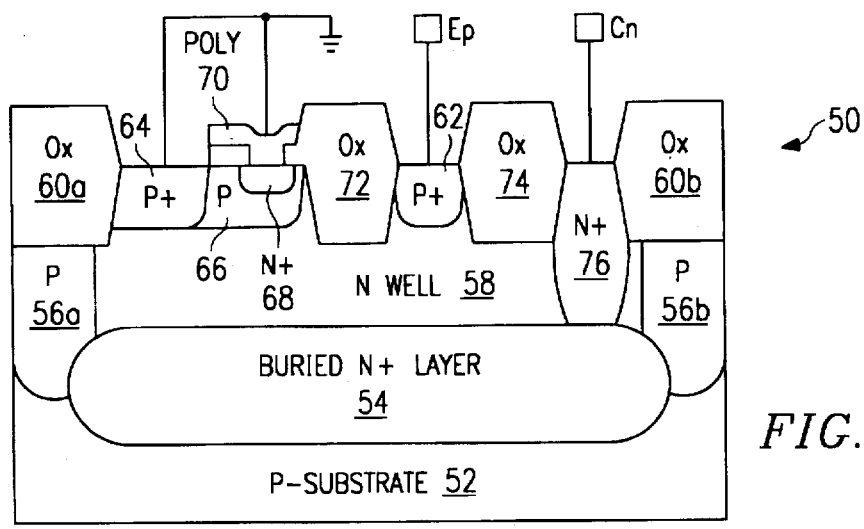
FIGS. 3A & 3B are a cross-sections of alternative ESD protection circuit structures in accordance with the present invention.
Figure 3B:
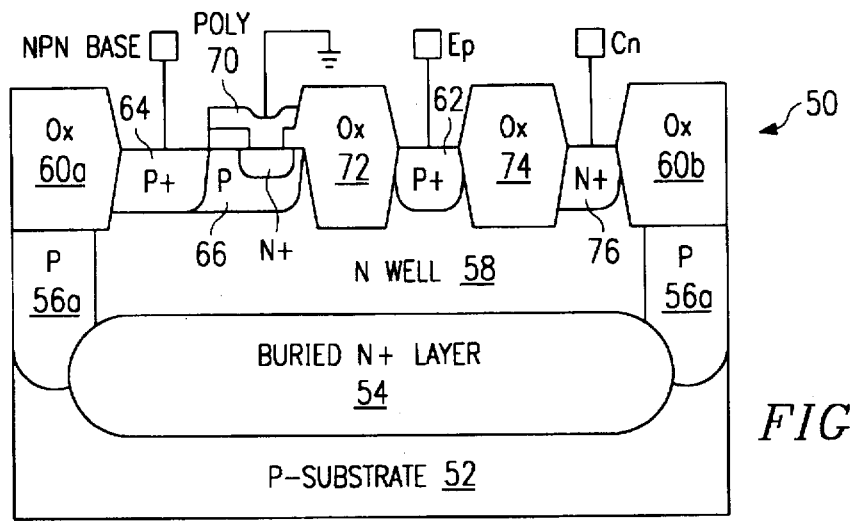

With reference to FIGS. 3A & 3B, there is illustrated in cross-section an exemplary 100 µm-wide Bipolar SCR ("BSCR"), designated generally by reference numeral 50, that was fabricated in an 0.8 µm BiCMOS process. The circuit 50 in comprised of an P-substrate 52 which underlies a buried $N^+$ layer 54. The buried $N^+$ layer 54 provides a low collector resistance for a vertical NPN transistor that will be assembled on the structure, as detailed below. The buried $N^+$ layer 54 is surrounded at its ends by P layers 56A and 56B, respectively, which also border the P-substrate 52. The P layers 56A & 56B extend towards the surface structure 50 so as to define an isolation region therebetween in which an N-well 58 is formed. As will be discussed below, the N-well serves as the NPN transistor collector region. Oxide layers 60A and 60B are developed in a conventional manner over P-layers 56A & 56B, respectively. A $P^+$ anode diffusion layer 62 is formed during the course of base $P^+$ implant 64 that is formed in a shallow P-base implant region 66. A shallow $N^+$ region 68 is formed in the P-base 66 and is covered by a layer of polysilicon 70. An oxide layer 72 is developed between the P-base 66 and $P^+$ anode 62. Likewise, an oxide layer is developed between the $P^+$ anode 62 and an $N^+$ region 76 that extends from the surface of the structure 50 and into the N-well 58, thereby serving as the NPN base contact.

Figure 4:
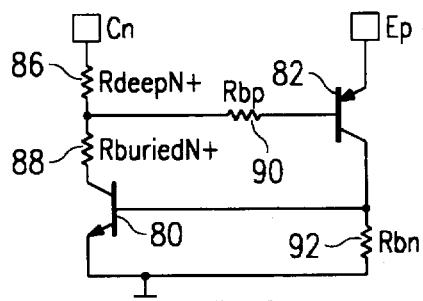
FIG. 4 is a schematic illustration of the ESD protection circuit depicted in FIG. 3A.

The diffusion of the $P^+$ anode 62 occurs during the course of the $P^+$ base implant 64 and is formed in the NPN transistor N-well 58 to form an PNPN SCR structure. This $P^+$ anode implant is advantageous, because it does not require additional masking incident to the process. The PNPN structure is defined by $P^+$ anode 62, N-well 58, P-base 66 and $N^+$ region 68. This Bipolar PNPN structure can be treated as an NPN (80) and PNP (82) transistor pair, and its representative schematic is depicted in FIG. 4. The PNP transistor 82 is represented by the $P^+$ anode 62, N-well 58 and P-base 66. The NPN transistor 80 is represented by the N- well region 68, P base 66 and the $N^+$ poly-emitter 68. Polysilicon layer 70 is an emitter layer which allows for formation the shallow $N^+$ region 68 by diffusion. $N^+$ region 76 serves as the NPN collector contact. $P^+$ region 62 serves as the SCR anode.

Figure 5:
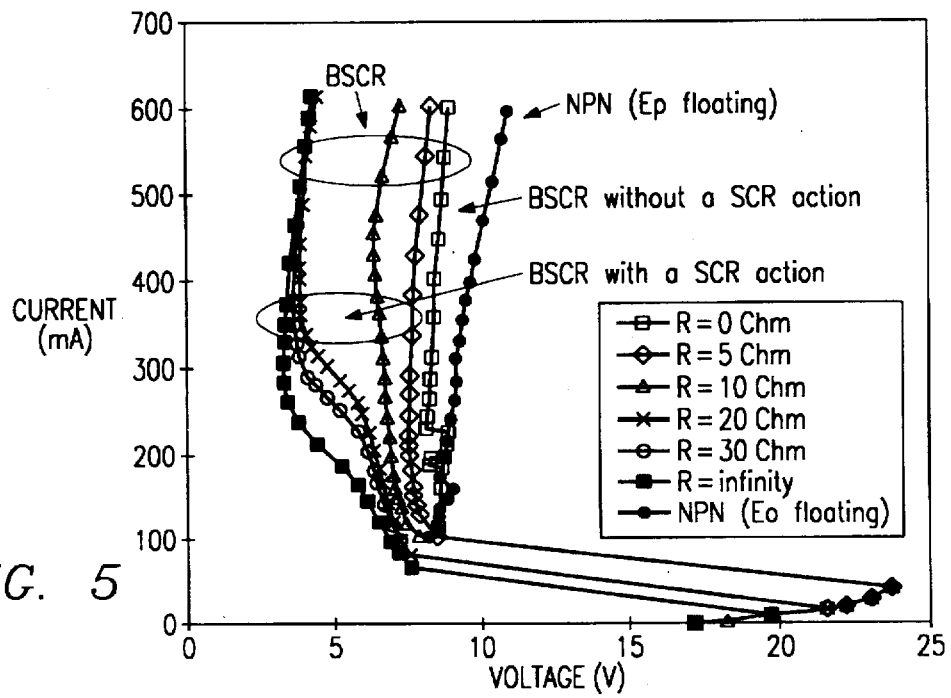
FIG. 5 is a graph of Resistor-dependent current-voltage curves for the Bipolar SCR device depicted in FIG. 3A.

With concurrent reference to FIGS. 3 and 4, the shallow $P^+$ base 64 serves both as a base for NPN transistor 80 as well as the collector of PNP transistor 82. Polysilicon region 70 and underlying $N^+$ region 68 constitute the emitter for NPN transistor 80. $P^+$ anode 62 serves as the emitter for PNP transistor 82. $N^+$ region 76 serves as the collector contact for the NPN transistor 80. With particular reference to the circuit schematic of FIG. 4, $R_{N-well}$ is the resistor for the N-well 58, $R_{buried}$ $N^+$ is the buried $N^+$ layer resistor 88, $R_{bp}$ is the base resistor of the PNP 90 of the PNP transistor, and $R_{bn}$ is the base resistor 92 of the NPN transistor 80. In instances where the Collector ($C_{NPN}$) is shored to the Emitter$_{PNP}$ $E_P$, as is typical in conventional SCR configurations, the trigger voltage $V_t$ is about 24 volts, as illustrated in FIG. 5. Such high trigger voltages require the use of a protection circuit that exhibits both a secondary ESD protection device and a series resistor, as is typical with conventional SCR circuits. However, the requirement for addition of a series resistor in the signal path precludes the use of such SCR circuitry in high speed submicron Bipolar/BiCMOS circuit applications. FIG. 5 also illustrates that when the Collector $C_{NPN}$ is shorted to the emitter $E_{PNP}$, the Bipolar SCR is provided with the same 7Volt $BV_{ceo}$ holding voltage as that of a conventional NPN transistor, with the exception of having the lower on-resistance value paired with the on-resistance value of the NPN transistor, as shown in FIG. 5. Accordingly, the illustrated Bipolar SCR configuration shows little improvement over conventional NPN transistors in terms of trigger ($V_t$) holding ($V_h$) voltages.

Although both the NPN 80 and PNP 82 transistors are "turned on" to provide a low on-resistance, the high $BV_{ceo}$ holding voltage indicates that there is no regenerative SCR action. The turn-on of the regenerative SCR requires that the PNP transistor 82 be biased by the NPN transistor 80 collector current, and vice versa. In the case of the NPN Collector ($C_{NPN}$) shorted to the PNP emitter ($E_{PNP}$), low base-emitter resistance of the PNP transistor 82 due to the low deep $N^+$ diffusion resistance $R_{deep\ N^+}$. This requires an additional current from the avalanching NPN collector-base junction to maintain the PNP transistor in the "on" state. For the same given current, increasing the emitter-base resistance in either of the NPN 80 or PNP 82 transistors will increase the base-emitter voltage $V_{be}$ and, as a result, a greater collector current flows into the bipolar transistor. The larger collector current in the bipolars will eliminate the need for an additional current source from avalanche generation, allowing for the occurrence of regenerative SCR action. Hence, holding voltage can be reduced from $BV_{ceo}$ to a lower value. For a given current, higher resistance will permit either of the NPN 80 or PNP 82 transistors to "turn on" more vigorously, resulting in a lower holding voltage $V_h$. This resistor-enhancement effect by an external PNP base-emitter resistor 90 (FIG. 4) between the NPN collector and PNP emitter is illustrated in FIG. 5. Moreover, holding voltage ($V_h$) decreases with increases in resistance (R).

As has been discussed previously, there exist two basic requirements for establishment of a desirable Bipolar SCR protection circuit. One is a low trigger voltage ($V_t$), and the other is a low holding voltage ($V_h$) resulting from a regenerative SCR action. By virtue of the Bipolar SCR design structure and circuit respectively depicted in FIGS. 3 and 4, the base of the NPN transistor 80 can be externally biased. As such, this external bias provides an additional means to control the BSCR through operation of the NPN transistor 80. As has been mentioned previously, the principal concern with using a Bipolar SCR is that the BSCR does not show any significant benefit over use of an NPN transistor, in terms of triggering ($V_t$) and holding ($V_h$) voltages. The principal reason for the holding voltage being substantially similar between the BSCR and NPN transistor is that the Collector-base avalanche breakdown is required to maintain the PNP transistor 82 in the "on" state. Although, both the NPN and PNP transistors are "turned on", thereby providing a low on-resistance in the circuit, there is no regenerative SCR action in the absence of added current flow from the avalanching collector base junction. In order to lower the holding voltage, it is required that the NPN be turned on "harder", thereby providing more current through the N-well resistor ($R_N$ well) to raise the base-emitter voltage of the PNP 82 and thereby turn the PNP on "harder". This can be achieved by increasing the base-emitter resistance $R_{be}$). Current forced through the base-emitter resistor will then forward-bias the NPN transistor 80 and enable the transistor 80 to turn "on" in the absence of the collector-base avalanching. NPN transistor activation in this manner reduces the trigger voltage $V_t$. A further aspect of the present invention provides a Zener diode to facilitate current biasing, as will be explained below in connection with the circuit diagram illustrated in FIG. 6.

Figure 6:
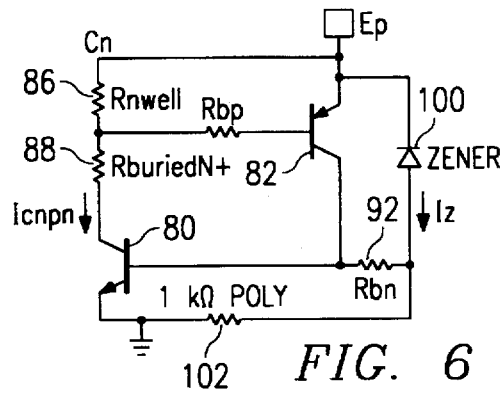
FIG. 6 is a schematic illustration of an alternative Bipolar SCR protection circuit employing an NPN Zener diode and a resistor.

With reference to FIG. 6, there is illustrated a Bipolar SCR ESD protection circuit fabricated in 0.8 μm by BiCMOS technology in accordance with the teachings of the present invention. The illustrated circuit is similar to that illustrated in FIG. 4, with the exception that an NPN Zener diode 100 and a 1K polysilicon resistor 102 are incorporated into the circuit. The Zener diode 100 is formed by the base-emitter junction of the NPN transistor 80. The turn-on voltage of the Zener diode 100 is the NPN base-emitter breakdown voltage, which is required to be slightly higher than the power supply voltages for a given process to ensure that the ESD protection circuit will not be triggered during the course of the normal circuit operation. It may be optionally desirable to provide a forward diode string (not shown) in series with the Zener diode 100 to increase the circuit trigger voltage, particularly for those Zener breakdown voltages that are lower than the power supply voltage. During an ESD event, when the pad voltage exceeds the Zener breakdown voltage, the Zener diode 100 breaks down, and the current flows through the 1K poly resistor 102 to trigger the Bipolar SCR NPN transistor, thereby turning "on" the BSCR to conduct the high ESD current.

Figure 7:
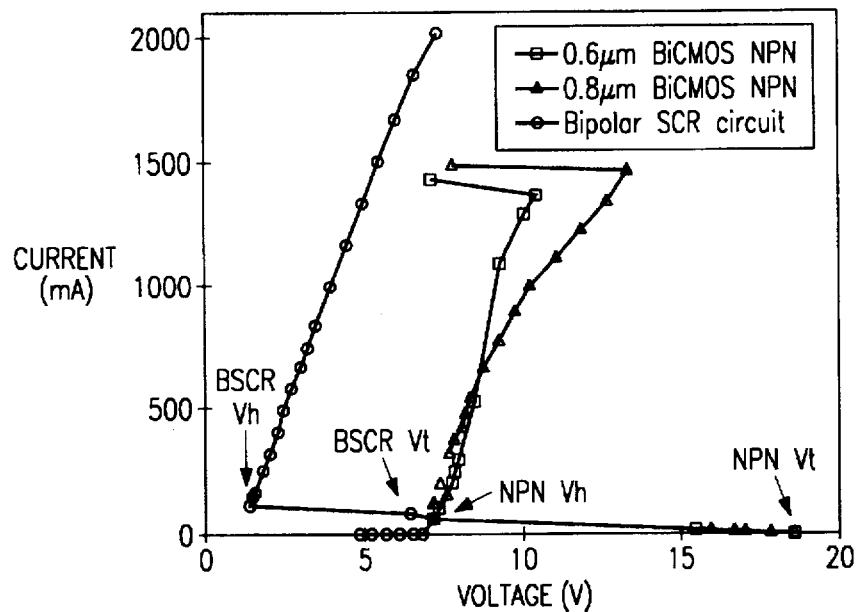
FIG. 7 is a high current-voltage graph of the Bipolar SCR ESD protection circuit illustrated in FIG. 6.

FIG. 7 illustrates a current-voltage graph for the protection circuit illustrated in FIG. 6, for which the deep $N^+$ collector diffusion ($N^+$ region 76 in FIG. 3A) is replaced by a more shallow $N^+$ diffusion (FIG. 3B) that extends into the N-well 58 rather than through the N-well 58 to the deep, buried $N^+$ layer 54. This more shallow diffusion enhances SCR action by increasing the base-emitter resistance of the PNP transistor 82.

FIG. 7 clearly demonstrates that the trigger voltage ($V_t$) can be lowered to 7V and the holding voltage ($V_h$) can be lowered to ~1.7V. The circuit can also handle up to 2 amps ESD current while the clamp voltage is maintained at only ~7V. Under an ESD test, the foregoing circuit with a 100 μm wide BSCR exhibits a 6.7 kV ESD threshold voltage and a 3.2V/μm² ESD efficiency (as measured in ESD volt as per unit of protection circuit area). In contrast, the NPN transistor manufactured in a substantially similar process exhibits only a 2.3V/μm² efficiency. Thus, a nearly 40% ESD efficiency gain is achieved by virtue of the construction of the present invention. Stated differently, the Bipolar SCR circuit of the present invention allows for a 40% capacitance load reduction for a given ESD threshold voltage. Moreover, as is shown in the current/voltage graph of FIG. 7, the circuit can handle up to about 2 amp ESD current without any damage. At 2 amps, the clamp voltage is about 7V. In contrast, the holding and trigger voltages for an NPN transistor fabricated in a similar process are both respectively considerably higher, at about 8 and 18 volts, respectively. It can thus be appreciated that the voltage reduction levels describe above afford a considerably greater level of circuit protection than has heretofore been obtainable.

In general, the disadvantage of using SCR ESD protection is its low holding voltage, which is typically lower than the power supply voltage of many associated circuits. However, the low holding voltage is beneficial for the ESD protection. There exists a "latch-up" concern for such low holding voltage SCR protection, in which the BSCR has a holding voltage lower than the power supply. Under normal operation, if there is a large noise signal imposed upon one or both of the input/output (I/O) or power supply pins, the SCR ESD protection may be triggered. The SCR is then in an "on" state with a low "on" resistance and a low holding voltage, and the current will flow through the SCR from the power supply to ground and eventually cause destruction of the circuit due to Joule heating. As the power supply voltage for many portable electronic devices, such as cellular telephones and notebook computers, is expected to diminish below the present standard of about 3.3V, the need for effective ESD protection stands to become more critical.

In view of the foregoing difficulties, it would be desirable to have an adjustable holding voltage and an adjustable trigger voltage SCR so that a user could select a holding voltage having a low value for valuable ESD protection, yet higher than the power supply voltage to eliminate the problem of "latch-up". Therefore, when the SCR is triggered by an external noise pulse that is higher than the power supply, the holding voltage would prevent the SCR from maintaining a continuous "on" state following passage of the pulse.

Figure 2:
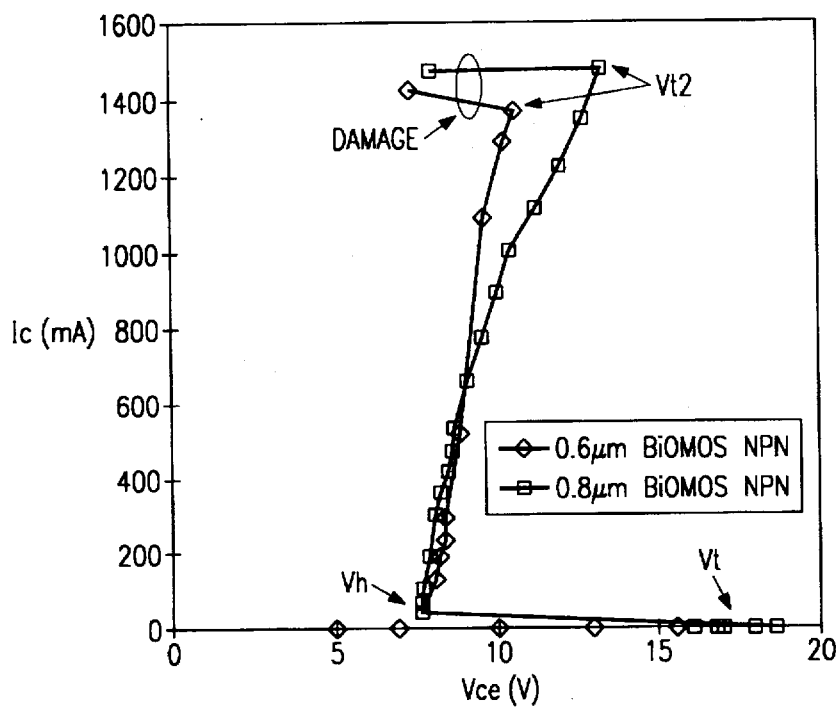
FIG. 2 is a current-voltage graph of 100 µm wide NPN structures in 0.6 & 0.8 BiCMOS processes.
Figure 8:
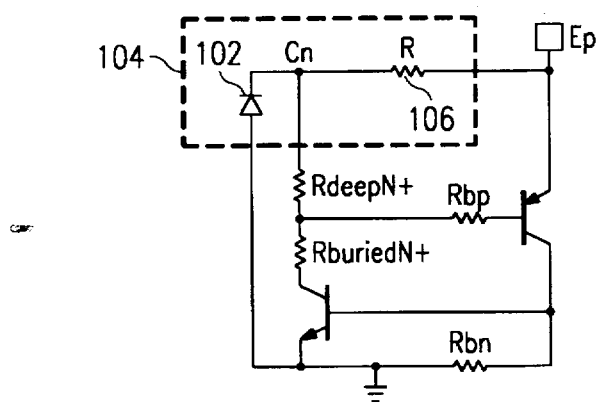
FIG. 8 is a schematic illustration of an alternative Bipolar SCR ESD protection circuit that is triggered by activation of the circuit PNF.
Figure 9:
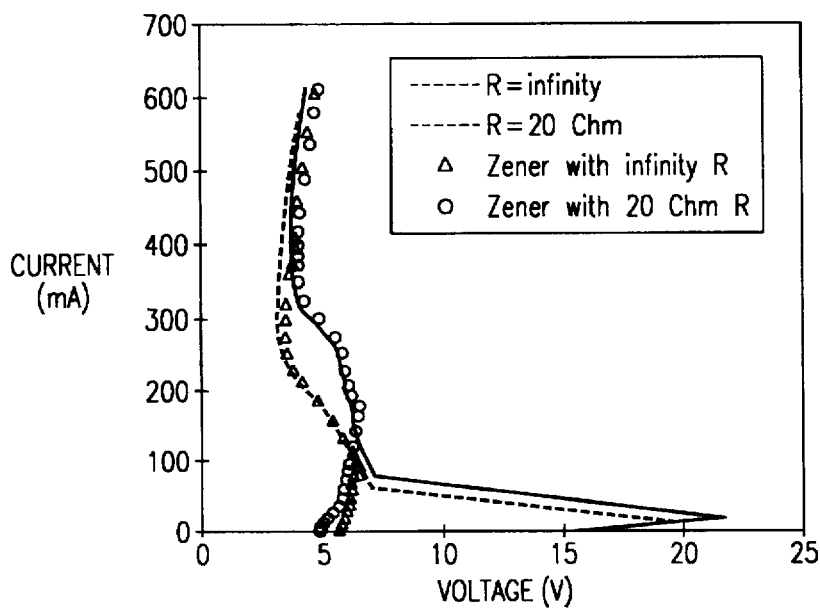
FIG. 9 is a current-voltage graph for the circuit illustrated in FIG. 8.

With the foregoing needs and difficulties in mind, a further alternative Bipolar SCR ESD protection circuit is illustrated schematically in FIG. 8. The illustrated circuit of FIG. 8 addresses these problems by providing, in combination with the improved Bipolar SCR circuits discussed previously (as depicted in FIGS. 4 & 6), a selectively tunable circuit that permits for adjustment of the holding voltage from about 7V (FIG. 2) to about 1.7V, as shown in FIG. 9. It can be appreciated that reduction of the holding voltage to the foregoing levels results in device holding voltages that are optimally slightly higher than the power supply voltage of the associated circuit.

In the embodiment depicted in FIG. 8, the Bipolar SCR is triggered by turn-on of PNP transistor 82. The PNP device 82 is activated by a triggering circuit, designated generally by shadow box 104, that is comprised of a Zener diode 100' and a resistor 106 that is positioned between $C_N$ and $E_P$. As holding voltage is a function of resistor value, and trigger voltage is a function of Zener breakdown voltage, resistance and breakdown voltage values for these respective components can be selected to render a protection circuit having optimal holding and triggering characteristics for a specific circuit to be protected.

When pad voltage exceeds the Zener breakdown voltage, current flows through the resistor 106 to turn "on" the PNP transistor 82, thus triggering the Bipolar SCR. The current-voltage graphs depicted in FIG. 9 illustrate a holding voltage as low as about 3V as resistance approaches infinity. As such, selection of a specific resistance value for the resistor 106 permits tailoring of the protection circuit, and specifically its holding voltage, for the specific performance characteristics of the associated circuit to be protected. While the invention has been described with reference to illustrative embodiments, the description is not intended to be construed in a limiting sense. Various other embodiments of the invention will be apparent to the person skilled in the art upon reference to this description. It is therefore contemplated that the appended claims will cover any such modifications of he embodiments as fall within the scope and spirit of the invention.

What is claimed is:

1. A structure protecting a circuit from electrostatic discharge, comprising:

a. a first semiconductor layer 52 formed from a semiconductor material of a first conductivity type;

b. a second semiconductor layer 54 overlying at least a portion of said first semiconductor layer 52, said second semiconductor layer 54 being formed from a material having a conductivity type opposite that of said first semiconductor layer;

c. a third semiconductor layer 58 at least partially overlying said second semiconductor layer 54, said third semiconductor layer having a conductivity type similar to that of said second semiconductor layer 54;

d. at least two laterally spaced first implant regions 62 and 64 positioned adjacent to said third semiconductor layer 58, said implant regions having a common conductivity type;

e. a second implant region 66 interposed between said at least two first implant regions 62 and 64;

f. a third implant region 68 contacting at least a portion of said second implant region 66 and having a conductivity type opposite that of said second implant region;

g. a fourth implant region 76 laterally spaced from said third implant region 68 and having a common conductivity type as said second implant region, said first 62, second 66 and third 68 implant regions, along with said third semiconductor layer 58 defining a Bipolar silicon controlled rectifier that is activatable by a triggering circuit comprising a current biasing device 100 and a resistor 106.

2. The structure according to claim 1, wherein said first 62 and second 66 implant regions are p conductivity regions, whereas said third implant region 68 and said third semiconductor layer 58 are n conductivity regions, thereby defining a Bipolar silicon controlled rectifier that is comprised of an npn transistor 80 and a pnp transistor 82.

3. The structure according to claim 2, wherein said triggering circuit is interposed between a collector of said npn transistor 80 and an emitter of said pnp transistor 82.

4. The structure according to claim 3, wherein said npn transistor 80 collector and said pnp transistor 82 emitter are connected to one another through a resistor.

5. The structure according to claim 3, wherein said fourth implant region 76 is a deep n type diffusion contact for said npn transistor 80 collector.

6. The structure according to claim 1, wherein said second implant region 66 is separated from one of said first implant regions 62, 64 by an oxide layer.

7. The structure according to claim 1, wherein said first 62, 64 and fourth 76 implant regions are separated by an oxide layer.

8. The structure according to claim 1, wherein an oxide layer 60 is positioned in overlying relation with at least one of said stack regions 56a and 56b.

9. The structure according to claim 1, wherein said fourth implant region 76 physically contacts at least said third semiconductor layer 58.

10. The structure according to claim 9, wherein said fourth implant region 76 extends through said third semiconductor layer 58 to contact said second semiconductor layer 54.

11. The structure according to claim 1, further comprising a semiconductor film 70 overlying at least a portion of said second implant region 66.

12. The structure according to claim 10, wherein at least a portion of said semiconductor film is electrically insulated from said second implant region 66.

13. The structure according to claim 1, wherein one of said first implant regions 64 serves both as a base for an NPN transistor as well as a collector of a PNP transistor.

* * * * *

UNITED STATES PATENT AND TRADEMARK OFFICE
CERTIFICATE OF CORRECTION

PATENT NO : 5,747,834
DATED : 5/5/98
INVENTOR(S): Julian Z. Chen, Ajith Amerasekera and Thomas Vrotsos It is certified that error appears in the above-identified patent and that said Letters Patent is hereby corrected as shown below:

On the title page, Item [73],
The Assignee should read: Texas Instruments Incorporated
Dallas, TX Signed and Sealed this Twenty-fifth Day of May, 1999

Attest:

Q. TODD DICKINSON

*Attesting Officer*　　　*Acting Commissioner of Patents and Trademarks*